United States Patent
Lin et al.

(10) Patent No.: US 7,265,182 B2
(45) Date of Patent: Sep. 4, 2007

(54) POLYAMIC ACID CROSS-LINKED POLYMER AND FORMABLE COMPOSITION THEREFROM

(75) Inventors: Pui-Yan Lin, Hockessin, DE (US); George Elias Zahr, Glen Mills, PA (US); Govindasamy Paramasivam Rajendran, Boothwyn, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 241 days.

(21) Appl. No.: 11/177,753

(22) Filed: Jul. 8, 2005

(65) Prior Publication Data

US 2006/0020081 A1 Jan. 26, 2006

Related U.S. Application Data

(63) Continuation of application No. 60/586,535, filed on Jul. 9, 2004.

(51) Int. Cl.
*C08F 8/32* (2006.01)

(52) U.S. Cl. .................... 525/183; 525/327.6; 525/375

(58) Field of Classification Search .............. 525/183, 525/327.6, 375
See application file for complete search history.

(56) References Cited

U.S. PATENT DOCUMENTS

| | | | | |
|---|---|---|---|---|
| 4,405,786 A | * | 9/1983 | D'Alelio et al. | 546/66 |
| 4,451,402 A | * | 5/1984 | D'Alelio et al. | 548/461 |
| 4,528,373 A | * | 7/1985 | D'Alelio et al. | 546/66 |
| 4,675,350 A | | 6/1987 | Marchetti et al. | |
| 5,047,479 A | | 9/1991 | Ohmae et al. | |
| 6,214,923 B1 | * | 4/2001 | Goto et al. | 524/514 |
| 6,221,940 B1 | * | 4/2001 | Puyenbroek et al. | 524/174 |

FOREIGN PATENT DOCUMENTS

| | | |
|---|---|---|
| JP | 02-014406 | 1/1990 |
| JP | 2002-060490 | 2/2002 |
| JP | 2002-076619 | 3/2002 |
| JP | 2002-076641 | 3/2002 |
| JP | 2002-144475 | 5/2002 |
| JP | 2002-219789 | 8/2002 |
| JP | 2002-264267 | 9/2002 |
| JP | 2002-363283 | 12/2002 |
| JP | 2003-060352 | 2/2003 |
| JP | 2003-192788 | 7/2003 |
| JP | 2003/342346 A * | 12/2003 |

OTHER PUBLICATIONS

Book of Abstracts, 211TH ACS National Meeting, New Orleans, LA, Mar. 24-28, 1996, POLY-016, Publisher: American Chemical Society, Washington, D.C. (Book Not Supplied).

Feiring et. al., Synthesis and Properties of Fluorinated Polyimides from Novel 2,2'-Bis (Fluoroalkoxy) Benzidines, Macromolecules, 1993, pp. 2779-2784, vol. 26 (11).

N. Damaskos et. al., Measuring Dielectric Constants of Low Loss Materials Using a Broadband Cavity Technique, Microwave Journal, 1995, pp. 140-149, vol. 38.

* cited by examiner

*Primary Examiner*—Bernard Lipman

(57) ABSTRACT

Cross-linked polymers comprising an anhydride or partially hydrolyzed anhydride functionalized polymer having oligomeric polyamic acid cross-links are provided. In solution, a polymer of the invention forms a formable gel. The formable gel is useful for forming shaped articles that are useful for electronics applications.

22 Claims, 1 Drawing Sheet

POLYAMIC ACID CROSS-LINKED POLYMER AND FORMABLE COMPOSITION THEREFROM

FIELD OF THE INVENTION

The present invention is drawn to a cross-linked polymer comprising an anhydride or partially hydrolyzed anhydride functionalized polymer having oligomeric polyamic acid cross-links providing a polymeric composite on a molecular scale. In solution, the polymer of the invention forms a formable gel. The formable gel hereof is useful for forming shaped articles thereof which shaped articles are particularly well suited for electronics applications. The shaped articles are characterized by low CTE (coefficient of thermal expansion), low dielectric constant (Dk), low dissipation factor (Df), high strength, high modulus and high toughness.

BACKGROUND OF THE INVENTION

It is known in the art to employ organic polymers having low dielectric constant in electronic applications such as integrated circuit chip substrates and circuit boards. The requirements for such applications include low CTE (<120 ppm/C), low flammability (typically V-0), low dielectric constant (<4.0) ($D_k$), low electrical dissipation factor (<0.03) ($D_f$). By far the most common resin in commercial use is mineral filled epoxy resin containing halogen flame retardant.

Electronic circuits are exposed to repeated changes in temperature and humidity during processing and in use. Because the constituent components differ in CTE and moisture uptake, delamination of electrical contacts may occur. Furthermore, moisture may induce corrosion. Reliability of electronic circuits can be improved if the dielectric material employed therein exhibits a CTE close to that of silicon (3-5 ppm/° C.) or copper (~18 ppm/° C.), low moisture absorption, and improved toughness. The epoxy dielectrics in widespread commercial use are widely regarded in the art as unsuitable for the next generation of electronic circuitry which is characterized by higher circuit density and smaller electrical contacts (which means more highly concentrated mechanical stress) the non-woven composite fabric of the invention.

The electrical performance of electronic components is affected by the properties of the dielectric material. When a high frequency electronic signal propagates through a conductor (for example, printed circuits on a circuit board), an electromagnetic field permeates into the organic polymeric material adjacent to the conductor. The interaction between the organic polymeric material and this electromagnetic field affects the propagation properties of the signal. These interactions are especially important for high circuit density and high frequency applications. For these reasons, the dielectric properties of the organic polymeric material are important. In particular the dielectric constant determines the speed of signal propagation through the circuit and affects signal cross talk between circuits, and the dissipation factor determines signal loss.

With each new generation of products circuit density increases while signal frequencies increase, thereby placing ever greater demands upon the organic polymers employed as dielectric material therein. Ever lower dielectric constant, low dissipation factor must be coupled with precisely controlled CTE and toughness.

In addition, flammability is an on-going concern halogen-containing flame-retardants commonly employed in commercial epoxy compositions in order to provide Underwriters Laboratory V-0 ratings are becoming subject to ever more stringent environmental controls. Thus a candidate material for the next generation product must also meet the V-0 requirement without use of halogen containing flame-retardants.

An additional pragmatic requirement is that any candidate material must exhibit the processibility of an epoxy thermoset in order to employ existing manufacturing equipment. This is mostly a requirement concerning flow and formability, particularly in vacuum forming.

Japanese Kokai JP 2003-060352 discloses a multilayer printed wiring board employing heat resistant films formed from polymers such as polyaramids, aromatic polyimides, poly paraben imidazole resin, poly paraben oxazole resin, and poly paraben thiazole resin. Epoxies are employed to bind the films to copper. The resulting printed wiring board is said to exhibit mechanical strength, heat resistance, adhesion strength, durability dimensional stability, and insulation reliability enabling high density of a wiring. Japanese Kokai JP 2002-264267, JP 2002-144475, JP 2002-076641, JP 2002-076619 and JP2002-219789 further describe various aspects and embodiments of the printed wiring boards thereof.

Japanese Kokai JP2002-363283 and JP2002-060490 disclose a polyimide resin which is characterized by low CTE (13-29 ppm) and low dielectric constant (2.57-2.96). The polyimide is prepared from a polyamide acid precursor. The polyamide acid is obtained by reacting in an organic solvent acid anhydrides consisting of an anhydride (either pyromellitic acid anhydride or 3,3',4,4'-biphenyltetracarboxylic acid dianhydride), and 2,2-bis(3,4-dicarboxyphenyl)hexafluoropropane, with 2,2'-disubstituted-4,4'-diaminobiphenyls and another a aromatic diamine selected from 2,2-bis (4-aminophenoxyphenyl)propanes, 1,1-bis(4-(4-aminophenoxy)-3-t-butyl-6-methylphenyl)butane and 2,2-bis(3-amino-4-methylphenyl)diisopropylbenzenes.

Japanese Kokai JP2003-192788 discloses a polyimide copolymer derived from pyromellitic anhydride useful for flexible printed wiring boards. The copolymer disclosed is characterized by heat resistance, insulating resistance, chemical resistance, low modulus of elasticity, and low CTE (15-25 ppm at 100-200° C.). Japanese Kokai JP,02/014406A1 discloses an improvement thereto characterized by a CTE 10~20 ppm @100~200 C, which is close to the CTE of metal foil so that metal foil laminated material offers good coplanarity without warpage or other damage such as cracks, and delamination.

Auman et al, "Fluorinated polyimides for interlayer dielectric applications: Tailoring of properties via copolymerization," Book of Abstracts, 211th ACS National Meeting, New Orleans, La., Mar. 24-28 (1996), POLY-016. Publisher: American Chemical Society, Washington, D.C. discloses rod-like fluorinated polyimides for interlayer dielec. (ILD) applications. Copolymerization is disclosed as a means for tailoring properties of rigid polyimides. The rod-like structures disclosed therein exhibit very low in plane (CTE), with anisotropic dielectric properties. Also disclosed is modification of the highly rod-like polyimide incorporation of a more flexible fluorinated comonomer, 6FDA, at various levels to increase CTE and balance dielec. const.

Feiring et al,"Synthesis and properties of fluorinated polyimides from novel 2,2'-bis(fluoroalkoxy)benzidines". Macromolecules (1993), 26(11), 2779-84 discloses polyimides prepd. from 2,2'-bis(fluoroalkoxy)benzidines and several dianhydrides. The diamines, containing. OCF3, OCF2CF2H, and OCF2CFHOC3F7 groups, were obtained from the corresponding 3-(fluoroalkoxy)nitrobenzenes by reduction to hydrazo derivatives., followed by benzidine rearrangements. Polymers prepared from 2,2'-bis(trifluoromethoxy)benzidine showed a combination of low dielectric. constant., moisture absorption, CTE and high thermal stability.

Marchetti et al, U.S. Pat. No. 4,675,350 discloses an oligomeric polyimide curing agent for epoxy via a polyamic acid precursor. The resulting cured epoxy is said to exhibit higher glass transition temperature, higher toughness, and improved chemical resistance.

Ohmae et al, U.S. Pat. No. 5,047,479 discloses ethylene polymer functionalized with maleic anhydride, and partially cross-linked by polyamide to form a thermoplastic material.

SUMMARY OF THE INVENTION

One aspect of the present invention is a cross-linked polymer comprising an anhydride- or partially hydrolyzed or esterified anhydride-containing polymer and cross-linking moieties comprising oligomeric polyamic acid moieties, said cross-linked polymer having structure II:

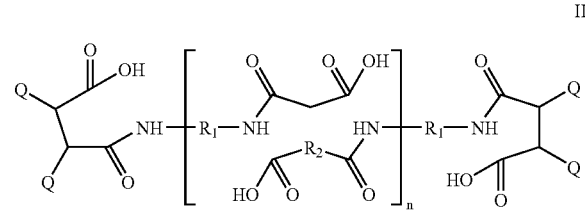

where $n=1-20$, $R_1$ is an aromatic or aliphatic diradical, $R_2$ is an aromatic or cycloaliphatic radical, and each Q is independently selected from H and one of the anhydride- or partially hydrolyzed or esterified anhydride-containing polymer with oligomeric polyamic acid cross-linking moieties, with the proviso that at least one Q must is the anhydride- or partially hydrolyzed or esterified anhydride-containing polymer with oligomeric polyamic acid cross-linking moieties. In some embodiments, the anhydride is maleic anhydride. Another aspect of the present invention is process comprising combining an anhydride- or partially hydrolyzed or esterified anhydride-containing polymer with a first solvent to form a first solution;

combining with a second solvent, to form a second solution, a polyamic acid represented by the structure, III,

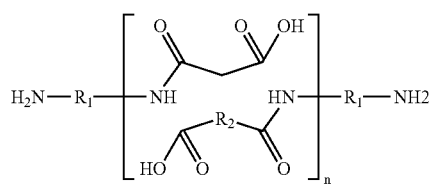

where $n=1-20$, $R_1$ is an aromatic or aliphatic diradical, and $R_2$ is an aromatic or cycloaliphatic radical;

combining said first solution with said second solution to form a combined solution, said first and second solvents being miscible and optionally the same;

and, causing a gel to form thereby.

A further aspect of the present invention is a formable composition comprising: a gel comprising a solvent and an anhydride- or partially hydrolyzed or esterified anhydride-containing polymer, and cross-linking moieties comprising oligomeric polyamic acid moieties said cross-linking moieties represented by the structure, III,

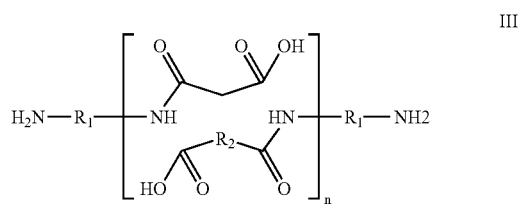

where $n=1-20$, $R_1$ is an aromatic or aliphatic diradical, $R_2$ is an aromatic or cycloaliphatic radical,

DETAILED DESCRIPTION

Figure 1:
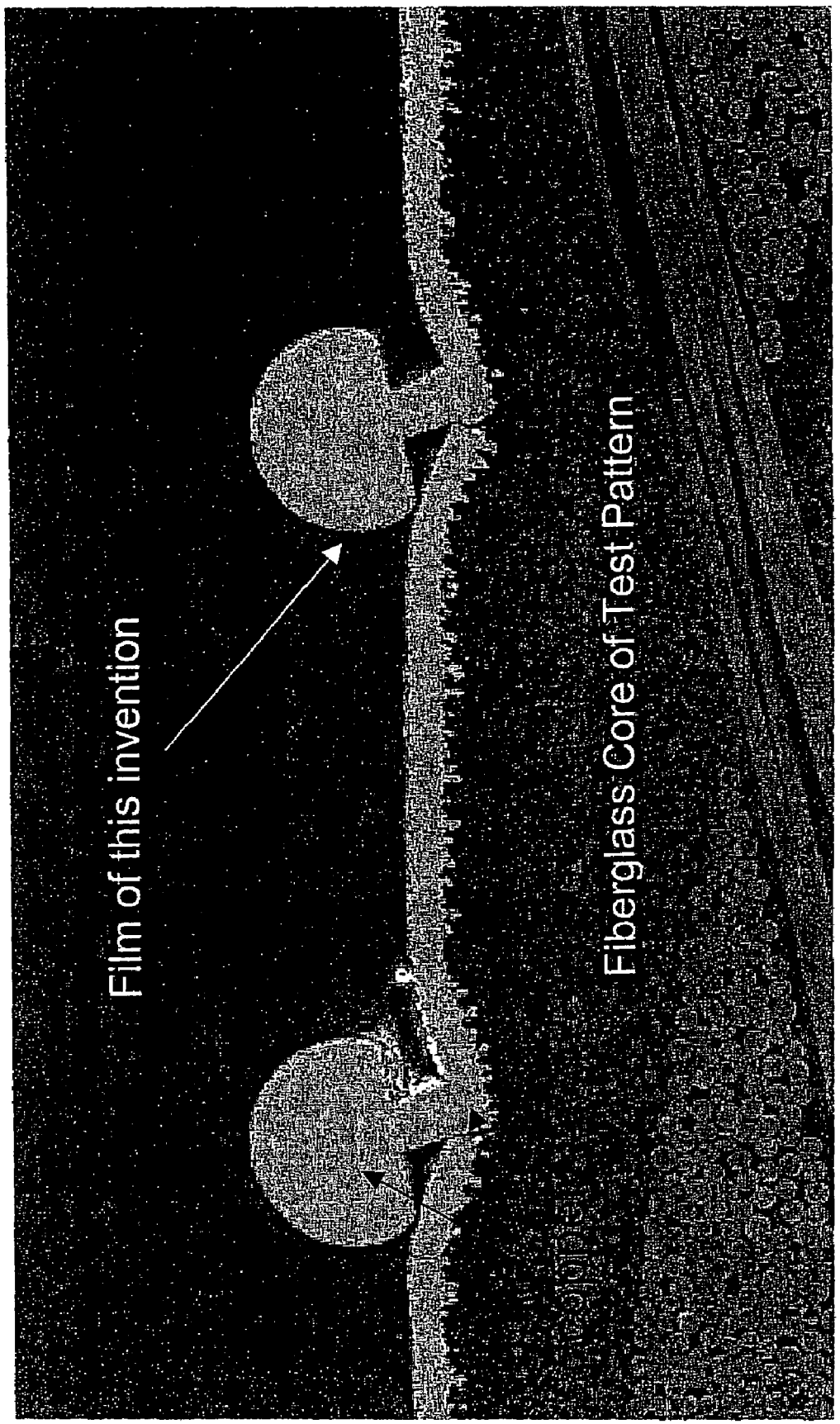
FIG. 1 shows the critical parameters of the thermoforming tests described in Examples 12-20.

According to the present invention is provided a cross-linked polymer comprising an anhydride- or partially hydrolyzed or esterified anhydride-containing polymer and cross-linking moieties comprising oligomeric polyamic acid moieties said polymer represented by the structure II,

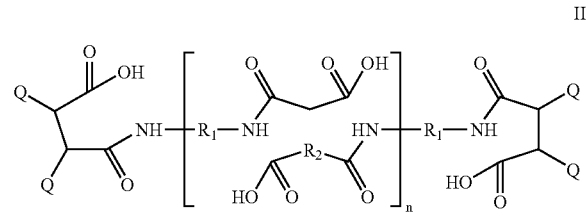

where $n=1-20$, $R_1$ is an aromatic or aliphatic diradical, $R_2$ is an aromatic or cycloaliphatic radical, and each Q is independently selected from H and the anhydride- or partially hydrolyzed or esterified anhydride-containing polymer with oligomeric polyamic acid cross-linking moieties, with the proviso that at least one Q is the anhydride- or partially hydrolyzed or esterified anhydride-containing polymer polymer with oligomeric polyamic acid cross-linking moieties.

Further provided according to the invention is a process comprising combining an anhydride- or partially hydrolyzed or esterified anhydride-containing polymer with a first solvent to form a first solution;

combining with a second solvent to form a second solution, a polyamic acid represented by the structure, III

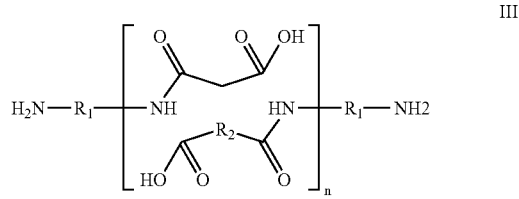

where $n=1-20$, $R_1$ is an aromatic or aliphatic diradical, and $R_2$ is an aromatic or cycloaliphatic radical;

combining said first solution with said second solution to form a combined solution, said first and second solvents being miscible, and may be the same;

and, causing a gel to form thereby.

Further provided according to the present invention is a formable composition comprising a gel comprising a solvent and an anhydride- or partially hydrolyzed or esterified anhydride-containing polymer and cross-linking moieties comprising oligomeric polyamic acid moieties said cross-linking moieties represented by the structure II,

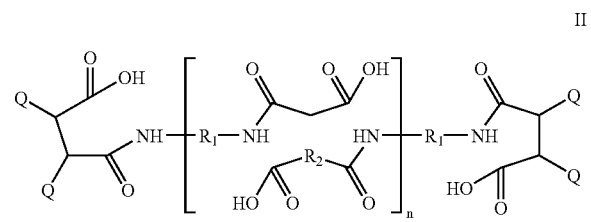

where n=1-20, $R_1$ is an aromatic or aliphatic diradical, $R_2$ is an aromatic or cycloaliphatic radical, and each Q is independently selected from H and the anhydride- or partially hydrolyzed or esterified anhydride-containing polymer with oligomeric polyamic acid cross-linking moieties, with the proviso that at least one Q is one of the anhydride- or partially hydrolyzed or esterified anhydride-containing polymer with oligomeric polyamic acid cross-linking moieties.

According to a process of the invention, an aromatic diamine is dissolved in a suitable solvent at a concentration of 1-60% by weight to form a diamine solution. An aromatic or cycloaliphatic dianhydride is added to the diamine solution the amount of said dianhydride being stoichiometrically adjusted according to well-known principles of chemistry so that the desired value of "n" in the polyamic acid having structure III is attained and so that said polyamic acid will have amine end groups. The combination thus made produces a solution of an amic acid oligomer having average length of 1-20 repeat units. In some embodiments n can have other values such as 6, 8, 10, and in some preferred embodiments n is within the range of 1 to 10 or 1 to 8. The number of average repeat units (average length of the oligomer) is controlled by the diamine to dianhydride molar ratio. For example if one mole of dianhydride is combined with two moles of diamine the polyamic acid oligomer of structure III is prepared having an average of one repeat unit (that is, n=1). If six moles of dianhydride are combined with seven moles of diamine the polyamic acid oligomer of structure III is prepared having an average of six repeat units (that is, n=6). Use of an excess of diamine in the stoichiometry produces an amic acid oligomer that has predominantly amine groups on both ends of the chain of the oligomer. Although in some embodiments, substantially all of the amic acid oligomer chains have amine groups on both ends of the chain thereof, by predominantly is meant that a significant majority, preferably at least 65 percent of the oligomer chains have amine groups on both ends thereof. In some embodiments, 75, 80, 90 percent or more of the oligomer chains have amine groups on both ends. Suitable for the practice of the invention are polyamic acid solutions having a concentration of The concentration of polyamic acid is in the range of 1-30% by weight, with 10-15% preferred. Optionally, some of the diamines or dianhydrides may be mono-functional to control the cross-link density of the final polymer.

In some preferred embodiments, the anhydride-containing polymer is a member of the family of poly(olefin-co-anhydride) copolymers. Poly(olefin-co-anhydride) copolymers such as are suitable for the practice of the present invention are well-known in the art. The practice of the present invention is not dependent upon the particular manner in which said copolymer is prepared. However, it can be prepared by addition copolymerization of an olefinically unsaturated monomer with an anhydride; or an olefin polymer may be grafted with an anhydride-containing moiety. While the present invention is not limited to maleic anhydride as a comonomer it is found in the practice of the invention that maleic anhydride is highly preferred due in part to its ability to copolymerize and react with amine ends of diamines. Herein, although mention is made of maleic anhydride, the reference to maleic anhydride is intended to refer to a preferred embodiment, and not limiting as to the use of other copolymerizable anhydrides.

Any olefinically unsaturated monomer or combination of monomers such as are known in the art may be employed in the current invention for the formation of the anhydride containing polymer starting material. Included are olefins, such as ethylene, propylene and other alkenes, vinyls such vinyls substituted aromatic monomers as styrene and substituted stylenes, vinyl ethers, vinyl acetate, vinyl esters, vinyl halides, and acrylic monomers such as acrylic esters, acrylic acids, such as methyl acrylate or methyl methacrylate, acylamides acrylonitrile, vinyl ketones, allyl monomers and other vinyl monomers such as vinyl sulfonic acid, vinyl silanes and other olefinic monomers. The anhydride containing copolymer can be either a regular alternating, random, block or graft copolymer, the specific structure being determined by the stoichiometry and the relative rates of reaction of the monomers, as will be appreciated by one of skill in the art.

It will be appreciated by one of skill in the art that hydrocarbon monomer units in the anhydride containing polymer provide lower dielectric constant than will for example, nitrogen or oxygen containing monomers. On the other hand, acrylics will exhibit superior adhesion to metal. It may, therefore, depending upon the requisites of a particular application, be desirable to incorporate more than one olefinically unsaturated monomer into the anhydride containing polymer in order to provide a certain mix of properties not available from a single such monomer. Thus terpolymers, tetrapolymers and the like are fully contemplated to be within the scope of the present invention.

Preferred anhydride containing polymers include poly (ethylene-alt-maleic anhydride), poly (methyl vinyl ether-alt-maleic anhydride), and polybutadiene grafted with maleic anhydride. Molar concentration of maleic anhydride in the polymer suitable for the practice of the present invention is in the range of 3 to 50%.

According to a process of the invention, the anydride-containing polymer thus prepared or a mixture of suitable anhydride containing polymers is dissolved in the same solvent used to dissolve the polyamic acid, or a solvent which is miscible therewith at a concentration in the range of 5 to 60% by weight, preferably 30-55% by weight. One of skill in the art will appreciate that the optimum concentration range will depend upon the particular polymer and solvent employed.

The polyamic acid solution and the anhydride-containing polymer solution are mixed together to generate a combined solution. The relative amounts of the two solutions are adjusted so that the number of moles of anhydride is essentially equal (e.g., ±5%) to the number of amine ends on the amic acid oligomer. This helps to minimize the moisture absorption of the fully imidized shaped article which can be prepared from the formable composition hereof. If the imidized shaped article is protected from moisture by some other means, or the application is not moisture sensitive, then this stoichiometric match of the number of moles of maleic anhydride and amine ends is not critical. The impact of stoichiometry on CTE is generally minimal over a broad range of compositions.

The polyamic acid solution and the anhydride-containing polymer solution are mixed together to generate a combined solution. In a preferred embodiment the solution is cast into a film or sheet prior to gel formation. Any method for solution casting such as is known in the art may be employed including but not limited to use of a frame and doctor blade. The film or sheet so prepared will spontaneously form a gel at any time from a few seconds to several hours from the time the combined solution is formed, depending upon both the concentration of the two solutions before combining and the specific reactants. In other embodiments, the solution need not be case into a sheet or film prior to gelation; rather the gel can be allowed to form in any convenient geometry. For example, the solution can be poured into a mold that is provided with a means for solvent escape.

Once the gel is formed, it is preferred to remove excess solvent by evaporation or extraction. Solvent removal can result in increased rigidity and reduced tackiness. It is found in the practice of the invention, that a freestanding gel sheet, which is formable and tack-free contains about 15 to 20% by weight of residual solvent. Gel formation can be accelerated by solvent removal prior to gel formation. The gel formed according to the process of the invention represents a plasticized polymer mass that can be molded and shaped. In one embodiment, the resulting polymer mass is subjected to compression molding or subject to compression and shear as in profile extrusion. It is highly desirable in so doing to avoid excessive heating, either by the application of external heat or by "working" the material, because excessive heating adversely affects the moldability.

It has been found in the practice of the invention that it may be desirable to further plasticize the gel sheet just prior to forming into a more complex shape. This can be accomplished by contacting the gel with any solvent, which is suitable for the practice of the present invention, as hereinbelow described. However, it is found in the practice of the present invention that a plasticizer solvent that is not suitable for forming said first or second solution can be used. As one of skill in the art will appreciate, certain solvents are more effective at plasticizing a particular gel than others. The desirability of using a plasticizer depends on factors including the intended application, and conditions used in processes such as thermoforming.

A plasticizing effect can be achieved by simply removing less solvent from the gel to begin with. It is found in the practice of the invention, that a better plasticizing effect can be achieved by simply incorporating as a co-solvent in said first or second solution a plasticizer which is not by itself suitable for use as the solvent therefore. From a practical standpoint, however, it may be more convenient in terms of handling and storage to remove sufficient solvent to produce a tack-free, free-standing gel sheet or film, and to introduce plasticizer only when necessary to achieve the specific objectives of a particular application, and to do so at a point closer to the actual shaping step. In some embodiments the plasticizer can be a solvent suitable for use as the solvent in said first or said second solution, and in some embodiments the plasticizer is not the solvent in said first or second solution. For example, the plasticizer can be added to the gel so that soaks into, also referred to herein as "imbibed into", the gel.

The practitioner hereof will understand that the addition of plasticizer solvent to the tack-free gel, which itself contains 15-20% of solvent, is not a requirement for the practice of the present invention. It is merely preferred for those embodiments hereof which involve a maximum of formability such as those involving encasing printed circuit boards in a dielectric polymer where spatial dimensions are very small, on the order of microns or tens of microns between components, and the requirements for uniformity are high.

The formability of the gel so prepared varies with the cross-link density of the gel. The higher the cross-link density, the more difficult it is to form the gel into a shaped article. A slow-to-gel composition may be formed at a given state of gelation, followed by additional gelation to higher cross-link density. It is found in the practice of the invention that the rate of gelation is very sensitive to the solids content of the combined solution. In one set of experiments it was found that a solution of 11% solids gelled completely in approximately 18 minutes while a 15% solids solution of the exact same composition gelled in about 8 minutes.

The viscosity of the gel can be reduced to improve formability by employing part of the anhydride-containing polymer in acid or ester form. This reduces the cross-linking reaction between the free amines ends in the oligomeric amic acid and the anhydride containing polymer.

In one embodiment, it is contemplated to solution cast a sheet on a moving belt or other substrate by combining the two solutions in situ from two independent feed streams. In such a case, high concentrations can be employed to achieve gel times on the order of seconds to minutes.

In a preferred embodiment, the combined solution is cast into film or sheet on a suitable substrate prior to gelation. After gelation and removal of excess solvent, the resulting gel sheet is a free-standing sheet which may be formed into more complex structures by the application of the appropriate molding forces and heat. One particularly preferred method of forming the sheet is vacuum forming. Thermoforming may also be employed.

When forming a shaped article from the formable composition it Is desirable to consider the need for solvent removal following shaping. Shaped articles having relatively high surface to volume ratios are best suited for fabrication from the formable composition of the invention assuming that it is desired to remove the solvent from the gel. This of course may not always be the case. Thus preferred shaped articles are small molded parts and sheeting, especially formed sheeting.

Upon completion of the forming operation, the so formed object is then subjected to temperatures in the range of 100 to 350° C. in order to cause the still formable shaped object to undergo imidization thereby causing a transition to a cross-linked polymer comprising a anhydride or partially hydrolyzed or esterified anhydride containing polymer and cross-linking moieties comprising oligomeric polyimide moieties said cross-linking moieties represented by the structure, I,.

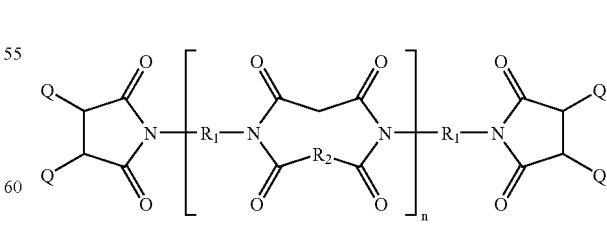

I where n=1-20, $R_1$ is an aromatic or aliphatic diradical, $R_2$ is an aromatic or cycloaliphatic radical, and Q designates H or the anhydride or partially hydrolyzed or esterified anhydride containing polymer with oligomeric polyamic acid cross-linking moieties, with the proviso that at least one Q is the anhydride or partially hydrolyzed or esterified anhydride containing polymer with oligomeric polyamic acid cross-linking moieties. Imidization can also be effected using known synthetic methods, such as chemical imidization at ambient temperature using a mixture of aliphatic carboxylic acid dianhydride like acetic anhydride and a tertiary amine like triethylamine or pyridine.

The polyamic acid can be prepared according to known methods from a tetracarboxylic acid dianhydride and diamine according to the reaction scheme

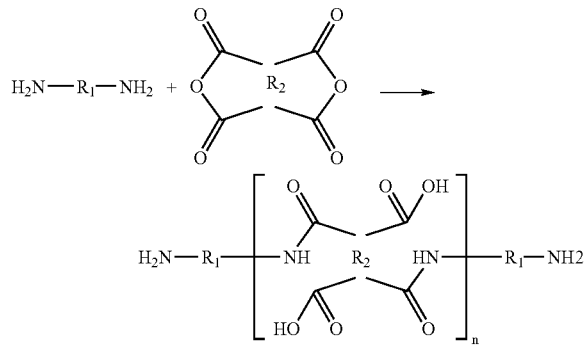

The tetracarboxylic acid dianhydride suitable for use in the processes disclosed herein include for example, aromatic tetracarboxylic acid dianhydrides such as pyromellitic acid dianhydride, biphenyltetracarboxylic acid dianhydride, benzophenonetetracarboxylic acid dianhydride, oxydiphthalic acid dianhydride and 4,4'-(hexafluoroisopropylidene)diphthalic acid dianhydride, naphthalene tetracarboxylic acid dianhydrides, Thiphene tetracarboxylic acid dianhydrides, 3,4,9,10-perylene tetracarboxylic acid dianhydrides Pyrazine tetracarboxylic acid dianhydrides, 3,4,7,8-anthraquinone tetracarboxylic acid dianhydrides and cycloaliphatic tetracarboxylic acid dianhydrides such as cyclobutanetetracarboxylic acid dianhydride and cyclopentanetetracarboxylic acid dianhydride. Pyromellitic acid dianhydride is preferred for some applications because of its relatively low cost and high rigidity.

The tetracarboxylic acid dianhydride suitable for use in the present invention can be in the form of pure anhydride or the tetracarboxylic acids and tetracarboxylic acid monoanhydrides capable of forming two imide rings upon cyclization. The tetracarboxylic acids and tetracarboxylic acid monoanhydrides are obtained by reacting the tetracarboxylic acid dianhydrides with water to cause ring opening. They may be derived from either aromatic tetracarboxylic acid dianhydrides or cycloaliphatic tetracarboxylic acid dianhydries. The tetracarboxylic acid dianhydrides may contain, as impurities, partly ring-opened monoanhydrides or tetracarboxylic acids. Moreover, these may be intentionally added to the tetracarboxylic acid dianhydrides to control the reaction rate or solubility.

The tetracarboxylic acid dianhydrides can be used each alone or in combination of two or more and can include tetracarboxylic acid dianhydrides not recited herein.

Suitable diamines include, for example, p-phenylenediamine, m-phenylenediamine, 4,6-dimethyl-m-phenylenediamine, 2,5-dimethyl-p-phenylenediamine, 2,4-diaminomesitylene, 4,4'-methylenedi-o-toluidine, 4,4'-methylenedi-2,6-xylidine, 4,4'-methylene-2,6-diethylaniline, 2,4-toluenediamine, 4,4'-diaminodiphenylpropane, 3,3'-diaminodipenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, benzidine, 3,3'-diaminobiphenyl, 3,3'-dimethyl-4,4'-diaminobiphenyl, 3,3'-dimethoxybenzidine, bis(p-aminocyclohexyl)methane, bis(p-.beta.-amino-t-butylphenyl) ether, bis (p-.beta.-methyl-.delta.-aminopentyl)benzene, p-bis(2-methyl-4-aminopentyl)benzene, 1,5-diaminonaphthalene, 2,6-diaminonaphthalene, 2,4-bis(.beta.-amino-t-butyl)toluene, 2,4-diaminotoluene, m-xylene-2,5-diamine, p-xylene-2,5-diamine, m-xylylenediamine, p-xylylenediamine, 2,6-diaminopyridine, 2,5-diaminopyridine, 2,5-diamino-1,3,4-oxadiazole, 1,4-diaminocyclohexane, piperazine, methylenediamine, ethylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 5-methylnonamethylenediamine, decamethylenediamine, 1,3-bis(3-aminophenoxy)benzene, 2,2-bis[4-(4-aminophenoxy)phenyl]propane, 1,3-bis(4-aminophenoxy)benzene, bis-4-(4-aminophenoxy)phenyl sulfone, bis-4-(3-aminophenoxy)phenyl sulfone, 9,9'-bis(4-aminophenyl)fluorene, and 2,2-bis(4-aminophenyl) hexafluoropropane, or siloxanediamines such as .alpha., .omega.-bis(3-aminopropyl)polydimethylsiloxane. These diamines can be used each alone or in combination of two or more. P-phenylenediamine is preferred because of low cost and rigidity In addition to the diamine and at least one tetracarboxylic acid component selected from a tetracarboxylic acid, a tetracarboxylic acid monoanhydride and a tetracarboxylic acid dianhydride, capable of forming two imide rings upon cyclization, there may be added a dicarboxylic acid and a dicarboxylic acid anhydride such as maleic acid, maleic anhydride, succinic anhydride, succinic acid, phthalic acid and phthalic anhydride or a monoamine such as aniline in a small amount for the purpose of having non-amine ends on the polyimide oligomer chain.

Suitable solvents include N-methyl-2-pyrrolidone, N,N-dimethylacetamide, N,N-dimethylformamide, dimethyl sulfoxide, tetramethyl urea, pyridine, hexamethylphosphoramide, methylformamide, N-acetyl-2-pyrrolidone, 2-methoxyethanol, 2-ethoxyethanol, 2-butoxyethanol, diethylene glycol monomethyl ether, diethylene glycol monoethyl ether, diethylene glycol monobutyl ether, cyclopentanone, cyclohexanone, cresol, .gamma.-butyrolactone, isophorone, N,N-diethylacetamide, N,N-diethylformamide, N,N-dimethylmethoxyacetamide, tetrahydrofuran, N-methyl-.epsilon.-caprolactam and tetrahydrothiophene dioxide {sulpholane}. Furthermore, the above-mentioned reaction can be carried out in a mixed solvent obtained by mixing two or more of the above-mentioned organic solvents. In addition, the above-mentioned preferable organic solvents, prior to use, can be diluted with another aprotic organic solvent such as an aromatic, an alicyclic or an aliphatic hydrocarbon, its chlorinated derivative (e.g., benzene, toluene, a xylene, cyclohexane, pentane, hexane, petroleum ether or methylene chloride), or dioxane which aprotic solvent diluents are not themselves solvents for the amic acid.

Suitable plasticizers include glycol ethers, such as diethylene glycol diethylether, diethylene glycol methyl ether, diethylene glycol ethyl ether, diethylene glycol butyl ether, ethylene glycol butyl ether, ethylene glycol diethyl ether, ethylene glycol methyl ether, ethylene glycol phenyl ether, propylene glycol butyl ether, propylene glycol dimethyl ether, propylene glycol methyl ether, propylene glycol propyl ether, propylene glycol phenyl ether. Also suitable are the ether acetate analogs of the above glycol ethers, such as diethylene glycol monoethyl ether acetate, propylene glycol monomethyl ether acetate, and the like. Other suitable plasticizers include carbonates such as propylene carbonate, butyrolactone, and dibasic ester. Mixtures of plasticizers may be employed.

Preferred are plasticizers with boiling points in the range of 100° C. to 260° C. Most preferred are plasticizers with boiling points in the range 160-210° C. Preferred plasticizers are selected from diethylene glycol methyl ether, propylene glycol methyl ether, propylene carbonate, and mixtures thereof.

The practitioner hereof will understand that the specific mechanical, thermal and chemical properties of the imidized shaped articles prepared according to the methods herein will depend upon the choice of the olefinic monomer species employed. However, by virtue of the polyimide cross-links, the shaped articles so prepared have relatively low coefficient of thermal expansion and the concomitant high dimensional stability. The shaped articles of the invention may be employed in a large number of applications including engine parts such as gaskets, parts for air-space vehicles that require high dimensional stability and low CTE.

Shaped articles formed from the formable composition, after imidization, in which the anhydride-containing polymers are poly(olefin-co-anhydride) copolymers are hydrocarbon polymers are particularly well suited to electronics applications, including printed circuit board substrates. One particularly preferred use is as a buildup material (BUM) in multilayer electronic circuits.

EXAMPLES

Test Methods

A. Dielectric Properties

The dielectric properties of the test materials were measured using a microwave resonance method. A Model 08 rectangular microwave cavity sold by Damaskos, Inc. of Concordville, Pa. was used. This cavity had a slot at its midplane to accommodate a planar test specimen. The internal dimensions of the cavity were 20.32 cm×3.81 cm. Two small loop antennas, positioned at one end of the cavity, permitted a microwave signal to be radiated into the cavity, pass through the sample under test, and then be detected by a microwave network analyzer (Model 8753 network analyzer from Agilent Technologies). By comparing the frequency and quality-factor (Q) of the TE resonance with the sample in place to that of the empty cavity, the dielectric constant and dissipation factor of the material was calculated from the known thickness of the sample using a mathematical analysis similar to that in N. Damaskos and B. Kelsall, "Measuring Dielectric Constants of Low Loss Materials using a Broadband Cavity Technique" Microwave Journal, pp 140-149, September 1995. The cavity has a fundamental frequency of approximately 815 MHz. Properties at discrete frequencies up to 4.6 Ghz were measured using harmonic modes.

Before dielectric measurements were performed, specimens were dried at 50° C. under vacuum overnight and then tested immediately under ambient room conditions. Where indicated, the specimen were then also conditioned in a chamber maintained at 85° C. and 85% RH for 20-24 hours and then tested immediately under ambient room conditions.

B. Thermomechanical Properties

The coefficient of thermal expansion (CTE) of the test samples was determined using a Thermal Mechanical Analyzer. The IPC-TM-650 Number 2.4.24.5 test method Method B was used. The sample in-plane (x,y direction) CTE's were measured by determining the change in dimension which accompanied a change in temperature from 50° C. to 200° C.

Examples 1-6

Preparation of Solution A:

A polyamic acid oligomer solution was made by the reaction of a diamine and dianhydride. The number of repeat units was controlled by the molar ratio of the diamine to the dianhydride. The diamine was dissolved in N,N-dimethylacetamide (DMAc) at 80° C. with stirring. After the diamine was dissolved in the DMAC, the dianhydride was added slowly to the diamine solution. The reaction solution was stirred further until all the dianhydride was dissolved.

Preparation of Solution B:

Ricon(r) 130MA20 (Sartomer) A polybutadiene adducted with 20% by weight maleic anhydride was combined in DMAC with either poly (ethylene-alt-maleic anhydride) or poly (methylvinyl ether-alt-maleic anhydride mixture of two poly (hydrocarbon co-maleic anhydride) polymers.

Film Casting

Solutions A & B were mixed at room temperature or below and cast into a film using a wet film applicator also known as a doctor blade. Solvent was removed in vacuum oven at 70° C. for two hours. A flexible yellow transparent film was formed.

This film was ready for use as a thermoset film. The film was heated to fully imidize and its properties are measured Table 1 shows the materials and amounts used for solution A Table 2 shows the materials and amounts used for solution B Table 3 shows the imidized film properties. CTE (Coefficient of thermal expansion) was measured in both X & Y direction. X-direction was the film casting direction, Y-direction was the transverse direction, Dk was the dielectric constant of a dry film at 1280 MHz and Df was the dissipation factor of a dry film at 1280 MHz

TABLE 1

| | (Solution A) | | |
|---|---|---|---|
| Example | p-Phenylene diamine (PPD) (gms) | Pyromelitic dianhydride (PMDA) (gms) | N,N-dimethylacetamide (DMAc) (gms) |
| 1 | 2.92 | 4.58 | 47 |
| 2 | 2.60 | 3.93 | 47 |
| 3 | 2.47 | 3.73 | 47 |
| 4 | 2.73 | 4.12 | 47 |
| 5 | 2.77 | 4.35 | 47 |
| 6 | 2.27 | 3.27 | 47 |

TABLE 2

(Solution B)

| Example | Ricon 130MA20 (gms) | Poly (ethylene-alt-maleic anhydride) (gms) | N,N-dimethyl-acetamide (DMAc) (gms) |
|---|---|---|---|
| 1 | 2.35 | 0.907 | 33 |
| 2 | 2.94 | 0.756 | 32 |
| 3 | 2.35 | 0.907 | 33 |

| Example | Ricon 130MA20 (gms) | Poly (methylvinyl ether-alt-maleic anhydride) (gms) | N,N-dimethyl-acetamide (DMAc) (gms) |
|---|---|---|---|
| 4 | 3.528 | 0.749 | 32 |
| 5 | 2.94 | 0.936 | 32 |
| 6 | 2.352 | 1.123 | 33 |

TABLE 3

(Imidized Film Properties)

| Example | CTE (ppm/° C.) (X-direction) | CTE (ppm/° C.) (Y-direction) | Dk at 1280 MHz | Df at 1280 MHz |
|---|---|---|---|---|
| 1 | 25 | 27 | 3.40 | 0.006 |
| 2 | 31 | 37 | 3.13 | 0.005 |
| 3 | 36 | 37 | 3.22 | 0.006 |
| 4 | 51 | 51 | 3.07 | 0.006 |
| 5 | 45 | 44 | 3.02 | 0.005 |
| 6 | 31 | 35 | 3.00 | 0.005 |

Examples 6A-6D

The same procedure in examples 1-6 was used. The solvent DMAC is replaced by 1-methyl-2-pyrrolidinone (NMP) and the Ricon(r) 130MA20 (Sartomer) A polybutadiene adducted with 20% by weight maleic anhydride. Was replaced by RB 1756 (Sartomer) a polybutadiene adducted with 17% by weight maleic anhydride.

TABLE 1-A (Solution A)

| Example | p-Phenylene diamine (PPD) (gms) | Pyromelitic dianhydride (PMDA) (gms) | 1-methyl-2-pyrrolidinone (NMP) (gms) |
|---|---|---|---|
| 6-A | 0.81 | 1.09 | 15 |
| 6-B | 0.65 | 1.09 | 15 |
| 6-C | 1.62 | 2.18 | 30 |
| 6-D | 1.08 | 1.09 | 15 |
| 6-E | 1.44 | 2.18 | 40 |

TABLE 2-A (Solution B)

| Example | RB 1756 (gms) | Poly (ethylene-alt-maleic anhydride) (gms) | 1-methyl-2-pyrrolidinone (NMP) (gms) |
|---|---|---|---|
| 6-A | 0.19 | 1.01 | 15 |
| 6-B | 0.86 | 0.23 | 15 |
| 6-C | 0.29 | 1.51 | 30 |
| 6-D | 0.18 | 1.25 | 15 |
| 6-E | 0.26 | 1.34 | 20 |

TABLE 3-A (Film Properties)

| Example | CTE (ppm/° C.) |
|---|---|
| 6-A | 15 |
| 6-B | 61 |
| 6-C | 38 |
| 6-D | 53 |
| 6-E | 29 |

Example 6-M

The same procedure in example 6-A was used. The p-Phenylene diamine (PPD) was replaced by 4-aminophenyl sulphone. 1.86 gms of 4-aminophenyl sulphone were reacted with 1.09 gms of Pyromelitic dianhydride in 15 gms of NMP to make solution A. 0.29 gms of RB 1756 and 1.51 gms of Poly (ethylene-alt-maleic anhydride) were dissolved in 10 gms of NMP to make solution B. A film was cast and imidized and has a CTE of 42 ppm/C.

Example 6-N

The same procedure in example 6-A was used except that aniline was added to block a portion of the chain ends of the oligomeric amic acid (make them none-reactive). 2.18 gms of Pyromelitic dianhydride were contacted with 0.47 gms of aniline in 20 gms of NMP. The solution was added to a solution containing 1.08 gms of PPD in 10 gms of NMP to make solution A. 0.38 gms of RB 1756 and 2.02 gms of Poly (ethylene-alt-maleic anhydride) were dissolved in 10 gms of NMP to make solution B. A film was cast and imidized and has a CTE of 38 ppm/C.

Example 6-O

The same procedure in example 6-A was used except that an organic modified montmorillonite clay (Cloisite 30B from the Southern Clay Products Inc.) was added to the oligomeric amic acid solution. 1.51 gms of PPD and 2.18 gms of Pyromelitic dianhydride in 30 gms of DMAc. 0.60 gms of Cloisite 30B was dispersed in this solution to make solution A. 0.37 gms of RB 1756 and 1.94 gms of Poly (ethylene-alt-maleic anhydride) were dissolved in 30 gms of DMAc to make solution B. A film was cast and imidized and has a CTE of 26 ppm/C.

Example 6-P

The same procedure in examples 6-A was used except that the hydrocarbon-maleic anhydride polymers were dissolved in acetone. 1.51 gms of PPD and 2.18 gms of Pyromelitic dianhydride in 30 gms of DMAc to make solution A. 0.37 gms of RB 1756 and 1.94 gms of Poly (ethylene-alt-maleic anhydride) were dissolved in 30 gms of Acetone to make solution B. A film was cast and imidized and has a CTE of 19 ppm/C. The dry film Dk at 1279 MHz is 3.04 and Df is 0.009.

Example 6-Q

The same procedure in example 6-A was used except that the hydrocarbon-maleic anhydride polymer was Poly (ethylene-alt-maleic anhydride) alone. 1.51 gms of PPD and 2.18 gms of Pyromelitic dianhydride in 30 gms of DMAc to make solution A. 2.29 gms of Poly (ethylene-alt-maleic anhydride) is dissolved in 20 gms of DMAc to make solution B. A film was cast and imidized and has a CTE of 15 ppm/C. The dry film Dk at 1279 MHz is 3.51 and Df is 0.013.

Example 6-R

The same procedure in examples 1A was used. 1.44 gms of PPD and 2.18 gms of pyromelitic dianhydride were dissolved in 25 gms of DMAc to make solution A. 1.60 gms of icon 130MA20 and 0.46 gms of Poly (ethylene-alt-maleic anhydride) were dissolved in 20 gms of DMAc to make solution B. A film was cast and imidized and has a CTE of 28 ppm/C. The dry film Dk at 1279 MHz was 2.95 and Df was 0.004.

Example 6-S

The same procedure in example 1 was used, except that maleic anhydride was added to block a portion of the chain ends of the oligomeric amic acid to reduce the cross-link density in the polymer. 1.44 gms of PPD and 2.18 gms of pyromelitic dianhydride were dissolved in 25 gms of DMAc to make solution A. 0.07 gms of maleic anhydride was added to solution A. 1.54 gms of Ricon 130MA20 and 0.45 gms of poly (ethylene-alt-maleic anhydride) were dissolved in 20 gms of DMAc to make solution B. A film was cast and imidized and has a CTE of 36 ppm/C. The dry film Dk at 1279 MHz was 2.96 and Df was 0.004.

Example 6-T

The same procedure in example 1 was used except that maleic anhydride was added to block a portion of the chain ends of the oligomeric amic acid to reduce the cross-link density in the polymer. Also poly (metylvinylether-alt-maleic anhydride) was used instead of poly (ethylene-alt-maleic anhydride). 2.88 gms of PPD and 4.36 gms of pyromelitic dianhydride were dissolved in 50 gms of DMAc to make solution A. [. 2.96 gms of Ricon 130MA20, 0.39 gms of Poly (metylvinylether-alt-maleic anhydride) and 0.39 gms of Maleic anhydride were dissolved in 40 gms of DMAc to make solution B. Solution A was added to solution B and a film was cast and imidized and haD a CTE of 36 ppm/C. The dry film Dk at 1279 MHz was 2.96 and Df was 0.005.

Example 6-V

The same procedure in example 6-A was used except that an organic modified montmorillonite clay (Cloisite 30B from the Southern Clay Products Inc.) was added to the oligomeric amic acid solution and a melamine polyphosphate flame retardant (Melapur 200 from DSM) was added to the hydrocarbon-maleic hydride solution. 1.14 gms of PPD and 1.72 gms of pyromelitic dianhydride in 25 gms of DMAc. 0.16 gms of Cloisite 30B was dispersed in this solution to make solution A. 2.45 gms of Ricon 130MA20 and 0.53 gms of Melapur 200 were dispersed in 4.45 gms of DMAC to make solution B. A film was cast and imidized and had a CTE of 52 ppm/C. The dry film Dk at 1279 MHz was 3.18 and Df was 0.005.

Examples 6AA-6BB

The same procedure in examples 1-6 was employed, except that the Poly (ethylene-alt-maleic anhydride) was not used

TABLE 1-AA

| | (Solution A) | | |
|---|---|---|---|
| Example | p-Phenylene diamine (PPD) (gms) | Pyromelitic dianhydride (PMDA) (gms) | N,N-dimethyl-acetamide (DMAc) ) (gms) |
| 6-AA | 1.08 | 1.64 | 25 |
| 6-BB | 1.89 | 3.27 | 45 |

TABLE 2-AA

| | (Solution B) | |
|---|---|---|
| Example | Ricon 130MA20 (gms) | N,N-dimethylacetamide (DMAc) (gms) |
| 6-AA | 2.45 | 2.45 |
| 6-BB | 2.45 | 2.45 |

TABLE 3-A

| | (Film Properties) | | |
|---|---|---|---|
| Example | CTE (ppm/° C.) | Dk at 1278 MHz | Df at 1278 MHz |
| 6-AA | 68 | 3.06 | 0.005 |
| 6-BB | 34 | 2.90 | 0.004 |

Example 7

In a nitrogen filled dry box, 1.456 g of p-phenylene diamine (PPD) was dissolved into 35 g of DMAc in a glass bottle at ca. 50° C. 3.033 g of BPDA [3,3',4,4'-biphenyltetracarboxylic dianhydride, CAS 2420-87-3, Aldrich Product 463310] powder was added to the PPD solution while the solution was still warm and stirred for about 45 min. until all BPDA solids were dissolved. This solution was removed from heat, capped, removed from the dry box to a laboratory hood, and cooled to room temperature. This solution was designated Part 1.

3.26 g of a 25% by weight stock solution of Ricon 130MA20 in DMAc was placed in a glass bottle together with 15.37 g of additional DMAc solvent and stirred for about 5 min. at room temperature. 0.42 g of poly(ethylene-alt-maleic anhydride) powder [Rutherford Chemicals, Product code: 27109P] was added and stirred for about 30 min. until all solids were dissolved. This solution was designated Part 2.

The two solutions, Parts 1 and 2, were mixed together well. The resultant solution was cast into several films on a polyester film substrate using a doctor blade set at a nominal 15 mil gate opening. The film casting was done within 20 min. of mixing the two solution parts and before solution viscosity increased significantly. The films were allowed to air dry for less than 2 hr to increase the viscosity of the film.

One film, designated L1-A was dried in a vacuum oven at 70° C. for 2 hrs. The resulting amic acid film was removed from the polyester backing substrate as a free standing film. It was then thermally imidized in a vacuum oven at 220° C. for 2 hr. The resultant film was kept in a dried state and tested for CTE and dielectric properties. The film was then conditioned in an environmental chamber at 85 C/85% relative humidity for 20 hours and dielectric properties measured immediately upon removal.

Another film, designated L1-B, was allowed to continue being air-dried in a laboratory hood for about 18 hours without the 70° C. vacuum oven drying step. The film was then removed from the polyester backing film and then thermally imidized in a vacuum oven at 220° C. for 2 hr, and tests were conducted similar to sample L1-A.

Compositions are summarized in Table 4. The properties of imidized films are shown in Table 5.

Example 8

The procedures of Example 7 were followed except that ODA [4,4'oxydianiline, CAS 101-80-4, Aldrich product 516805] was used in place of PPD and that NMP (n-methylpyrrolidone) was used as the solvent instead of DMAc. A film, designated L-2, was prepared and tested in the manner of L-1-A.

Compositions are summarized in Table 4. The properties of imidized films are shown in Table 5.

Example 9

A film, designated L-3, was prepared and tested using the procedures employed for L-1-A except that the anhydrides used were a mixture of BPDA and PMDA (pyromellitic dianhydride, CAS 89-32-7, Aldrich product 412287).

Compositions are summarized in Table 4. The properties of imidized films are shown in Table 5.

Example 10

A test coupon consisting of an epoxy/glass core laminated to a copper foil was fabricated using ordinary means known in the art. The copper layer was "circuitized" by removing part of the copper using standard electronics industry lithographic/etching techniques. The resulting structure consisted of parallel lanes of copper lines about 50 microns in width and 75 microns in height. Some of the copper lines were spaced about 300 microns apart.

A gel film was made as in the preceding examples, except that a larger batch was used and the film was dried with a hot air gun at 46° C. for 45 min. instead of vacuum oven. The composition is shown in Table 6.

TABLE 4

Compositions of Examples 7–9

| | Example | L-1A | L1-B | L-2 | L-3 |
|---|---|---|---|---|---|
| | | weight, g | | | |
| Part 1 | BPDA | 3.033 | 3.033 | — | 1.486 |
| | PMDA | — | — | — | 1.124 |
| | PPD | 1.456 | 1.456 | — | 1.456 |
| | ODA | — | — | 2.752 | — |
| | DMAc | 35.00 | — | — | 33.00 |
| | NMP | — | — | 40.00 | — |
| Part 2 | Ricon 130MA20 | 1.633 | 1.633 | 1.633 | 1.633 |
| | PEMA | 0.420 | 0.420 | 0.420 | 0.420 |
| | DMAc | 17.00 | — | — | 16.00 |
| | NMP | — | — | 17.00 | — |
| | Drying conditions | 70° C. vacuum oven, 2 hrs | air dried | 90° C. vacuum oven, 2 hrs | 80° C. vacuum oven, 2 hrs |
| | Imidization conditions | 220° C. vacuum oven, 2 hrs | 220° C. vacuum oven, 2 hrs | 200° C. vacuum oven, 2 hrs | 220° C. vacuum oven, 2 hrs |

TABLE 5

Properties of the Imidized Films of Examples 7–9

| | Film L1-A | Film L1-B | Film L-2 | Film L-3 |
|---|---|---|---|---|
| Film Thickness, microns | 46 | 46 | 44 | 41 |
| Dielectric Constant (2.55 GHz) | | | | |
| dry/20 C. | 3.10 | 3.15 | 3.07 | 3.02 |
| 85 C./85% RH 1 day | 3.35 | 3.42 | 3.07 | 3.31 |
| Dissipation Factor (2.55 GHz) | | | | |
| dry/20 C. | 0.006 | 0.005 | 0.008 | 0.006 |
| 85 C./85% RH 1 day | 0.018 | 0.018 | 0.015 | 0.020 |
| Weight gain after 85 C./85% RH exposure, % | 2.0 | 1.9 | 1.5 | 2.8 |
| CTE (ppm/C., 50–200 C.) | | | | |
| Machine direction | 50 | 45 | 58 | 44 |
| Cross direction | 49 | 48 | — | 44 |

TABLE 6

Composition of Example 10

| | | weight, g |
|---|---|---|
| Part A | PMDA | 10.8 |
| | PPD | 7.125 |
| | DMAc | 133.7 |
| Part B | Ricon 130MA20 | 6.95 |
| | PEMA | 2.375 |
| | DMAc | 89 |

The gel film thickness was around 19 microns. The film was placed over the copper lines of the test coupon, and the resulting assemblage was sandwiched between two sheets of Teflon(r) PFA (DuPont) film and two sheets of "Pacothane" (from Pacothane Technologies) padding material. The entire assembly was placed between metal plates and loaded into a TMP (Technical Machine Products Corp) vacuum press with platens heated to 90° C. The test part was about 15 cm×15 cm. A load of 60 kN was applied to the press. The test part was held at 90° C. for about 10 min. The press temperature was raised from 90° C. to 200° C. over about 10 minutes. The part was held at 200° C. for 2 hours thereby imidizing the amic acid moiety and simultaneously driving off the residual solvent, and then allowed to cool. The imidized film was found to be laminated to the test coupon. Cross-sectional scanning electron micrographs showed the film to conform around the copper lanes. The mushroom shape to the copper lines indicates that they were inadvertently overplated.

Examples 12-20

Effect of Plasticizers on Thermo-Formability of Films

Gel films were made and dried according to the methods taught herein wherein PPD and PMDA were combined in a 7/6 molar ratio to form the diamine that was in turn reacted with a solution of 100% Ricon in DMAc. Thermo-formability of these films was tested by laminating them over 3 strips of brass shims in a vacuum press. The brass shims were 25 microns in thickness, about 3-6 mm in width and about 3 cm in length. The brass shims were laid parallel to each other, about ½ cm apart, on a poly(tetrafluoroethylene)/glass release film. A gel film specimen was laid over the brass shims. Another poly(tetrafluoroethylene)/glass release film was placed over the resulting assembly. The entire assembly was sandwiched between two 0.6 mm thick stainless steel plates and placed into a vacuum press. The press was preheated to the temperature as indicated in Table 7. A load of 4450 N was applied for 30 min. The test article was then removed from the press.

The thickness of the film/brass laminate was measured over regions where there was only film, and over regions where there were both film and brass shim. The thickness differential is reported in Table 7. This thickness differential serves as an indication of the thermal formability of the film. For example, if there was no deformation of the film, the thickness differential in regions where there was a 25 microns thick brass film should be 25 microns. However, a 6 micron thickness increase, for example, over the brass region would indicate a film deformation in the thickness direction of 19 microns.

Examples 12-15 were conducted without addition of any plasticizer to the gel films except for the residual solvent therein. In examples 15-20, the gel films were immersed in plasticizing solvents as indicated. The thermal deformation results are shown in Table 6.

TABLE 7

Thermal deformation test results

| Example | Untreated amic acid film thickness, microns | added plasticizer, % wt. increase | Press Temperature ° C. | Thickness differential in regions over brass shim, microns | Approximate time needed for plasticizer absorption |
|---|---|---|---|---|---|
| 12 | 89 | none | 90 | 25 | n/a |
| 13 | 56 | none | 120 | 20 | n/a |
| 14 | 89 | none | 140 | 20 | n/a |
| 15 | 89 | none | 160 | 20 | n/a |
| 16 | 66 | diethylene glycol methyl ether, 12% | 120 | 13 | <2 min |
| 17 | 56 | diethylene glycol methyl ether, 15% | 120 | 6 | 10 s |
| 18 | 46 | diethylene glycol methyl ether, 26% | 120 | 6 | 10 s |
| 19 | 56 | propylene glycol methyl ether, 7% | 120 | 6 | <1 hr |
| 20 | 89 | propylene carbonate, 17% | 120 | 6 | 6 days |

Example 21

A Ricon 130MA20 maleic anhydride containing polymer was partially converted to the acid form in the following manner. 59.903 g of Ricon 130MA20 was dissolved and hydrolyzed in 59.903 g of a solution of tetrahydrofuran/distilled water (1:1 by weight) over a period of 1.5 hr. The solvents were then removed under a rotovap at 50° C., and further dried in vacuum oven for 2 days. The resulting solid was redissolved in DMAc to a 50% solids solution. 2.54 g of this hydrolyzed solution was then mixed with 2.45 g of a 50% solids dry Ricon 130MA20/DMAc solution, resulting in a polymer with 50 mole % of maleic anhydride groups hydrolyzed (Part 2).

The polyamic acid diamine solution was prepared by combining 3.27 g PMDA with 1.89 g PPD in 45 g of DMAc.

The two solutions were mixed and the viscosity measured with a Brookfield Model DV-II plus viscometer with a SC4-31 spindle. The viscosities recorded were: 114 cP (centipoise) after 2.5 hrs., 192 cP after about 20 hrs. In a control experiment where the Ricon 130MA20 was not hydrolyzed, the viscosity of the mixed solution was over 10,000 cP after about 30 min.

A film was cast with the solution made from the hydrolyzed polymer using a doctor blade. The cast film was air dried overnight. The resulting gel film was removed from the polyester film backing as a freestanding film. A portion of this gel film was then thermally imidized in a vacuum oven at 220° C. for 2 hrs. The coefficient of thermal expansion of the imidized film was found to be 81 ppm/° C. in the range 50-200° C.

Example 22

A coating of diethylene glycol methyl ether was sprayed on two polyester films. A second sample of the gel film made in Example 10 (dried but before exposure to imidization temperatures) was imbibed with diethylene glycol methyl ether by placing the gel film between the diethylene glycol methyl ether coated polyester films and then removing the polyester films. The weight increase of the film was 12%.

This gel film was laminated to a patterned test coupon like Example 10 except that the copper lanes on this test pattern were about 17 microns high, 40 microns width and spaced about 40 microns apart. It also had an extra layer of epoxy/copper layer on top of the fiberglass core similar to a build-up structure. The same laminating conditions and setup were used as in Example 10. After lamination, the gel film was found to be laminated to the test coupon. Cross-sectional scanning electron micrograph, FIG. 3, showed the film to conform around the copper lanes and the spaces between the copper were filled in by the film.

What we claim is:

1. A cross-linked polymer comprising an anhydride- or partially hydrolyzed or esterified anhydride-containing polymer, and cross-linking moieties comprising oligomeric polyamic acid moieties, said cross-linked polymer having structure II:

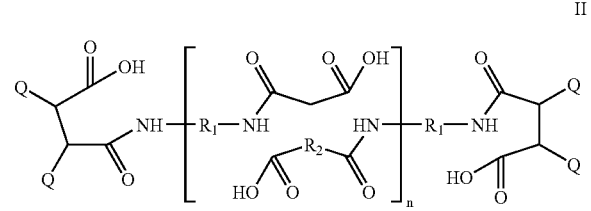

where n=1-20, $R_1$ is an aromatic or aliphatic diradical, $R_2$ is an aromatic or cycloaliphatic radical, and each Q is independently selected from H and the cross-linked polymer comprising oligomeric polyamic acid cross-linking moieties, with the proviso that at least one Q is the anhydride- or partially hydrolyzed or esterified anhydride-containing polymer with oligomeric polyamic acid cross-linking moieties.

2. The cross-linked polymer of claim 1 wherein the anhydride is maleic anhydride.

3. The cross-linked polymer of claim 2 wherein the anhydride containing polymer is selected from poly(ethylene-alt-maleic anhydride), poly (methyl vinyl ether-alt-maleic anhydride), and polybutadiene grafted with maleic anhydride.

4. The cross-linked polymer of claim 1 the anhydride containing polymer comprises more than one species of olefinic monomer unit.

5. The cross-linked polymer of claim 1 wherein the polyamic acid moiety is a diradical derived from the reaction of pyromellitic acid dianhydride and para-phenylene diamine.

6. A process comprising
    combining an anhydride- or partially hydrolyzed or esterified anhydride-containing polymer with a first solvent to form a first solution;
    combining with a second solvent, to form a second solution, a polyamic acid represented by the structure, III,

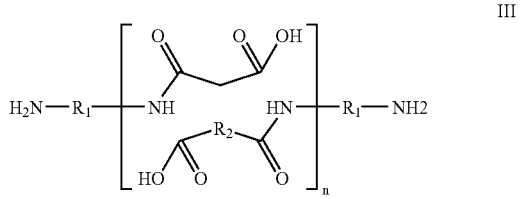

where n=1-20, $R_1$ is an aromatic or aliphatic diradical, and $R_2$ is an aromatic or cycloaliphatic radical;
    combining said first solution with said second solution to form a combined solution, said first and second solvents being miscible and optionally the same;
    and,
    causing a gel to form thereby.

7. The process of claim 6 wherein the anhydride is maleic anhydride.

8. The process of claim 7 wherein the anhydride containing polymer is selected from poly(ethylene-alt-maleic anhydride), poly (methyl vinyl ether-alt-maleic anhydride), and polybutadiene grafted with maleic anhydride.

9. The process of claim 6, claim 7 or claim 8 wherein the anhydride containing polymer comprises more than one species of olefinic monomer unit.

10. The process of claim 6 further comprising casting said combined solutions into a film or sheet prior to gel formation.

11. The process of claim 10 further comprising removing solvent from said combined solution prior to or during gel formation.

12. The process of claim 6 further comprising imbibing a plasticizer into the so formed gel.

13. The process of claim 12 wherein said plasticizer is selected from diethylene glycol methyl ether, propylene glycol methyl ether, propylene carbonate, and mixtures thereof.

14. The process of claim 6 wherein the polyamic acid is a reaction product of pyromellitic dianhydride and para-phenylene diamine.

15. A formable composition comprising: a gel comprising a solvent and a cross-linked anhydride- or partially hydrolyzed or esterified anhydride-containing polymer, and cross-linking moieties comprising oligomeric polyamic acid moieties to form a cross-liked polymer, said cross-linked polymer represented by the structure, III,

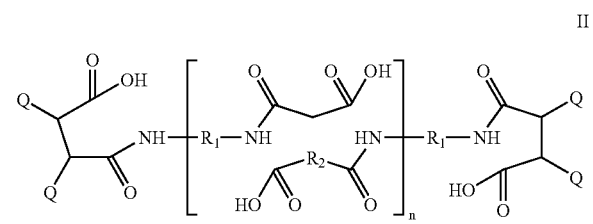

where n=1-20, $R_1$ is an aromatic or aliphatic diradical, $R_2$ is an aromatic or cycloaliphatic radical, and each Q is independently selected from H or the anhydride or partially hydrolyzed or esterified anhydride containing polymer with oligomeric polyamic acid cross-linking moieties with the proviso that at least one Q is said polymer having said oligomeric polyamic acid cross-linking moieties.

16. The formable composition of claim 15 wherein the anhydride is maleic anhydride.

17. The formable composition of claim 16 wherein the anhydride containing polymer is selected from poly(ethylene-alt-maleic anhydride), poly (methyl vinyl ether-alt-maleic anhydride), and polybutadiene grafted with maleic anhydride.

18. The formable composition of claim 15, claim 16 or claim 17 wherein the anhydride containing polymer comprises more than one species of olefinic monomer unit.

19. The formable composition of claim 15 wherein the solvent concentration is in the range of 15 to 20% by weight.

20. The formable composition of claim 15 further comprising a plasticizer.

21. The formable composition of claim 20 wherein said plasticizer is selected from diethylene glycol methyl ether, propylene glycol methyl ether, propylene carbonate, and mixtures thereof 22. The formable composition of claim 15 wherein the polyamic acid is a reaction product of pyromellitic dianhydride and para-phenylene diamine.

* * * * *